United States Patent [19]
Oldham

[11] 4,441,036
[45] Apr. 3, 1984

[54] MONOLITHICALLY INTEGRATED CIRCUIT WITH CONNECTIBLE AND/OR DISCONNECTIBLE CIRCUIT PORTIONS

[75] Inventor: William G. Oldham, El Cerreto, Calif.

[73] Assignee: Siemens Aktiengesellschaft, Berlin & Munich, Fed. Rep. of Germany

[21] Appl. No.: 294,300

[22] Filed: Aug. 19, 1981

[30] Foreign Application Priority Data

Aug. 27, 1980 [DE] Fed. Rep. of Germany ....... 3032306

[51] Int. Cl.³ .................. H03K 17/687; H01L 27/14; G11C 7/00
[52] U.S. Cl. ................................... 307/242; 307/464; 307/580; 365/200; 371/8; 357/29
[58] Field of Search ............... 307/580, 311, 312, 448; 371/8, 9; 365/200; 357/23 VT, 29

[56] References Cited

U.S. PATENT DOCUMENTS

| | | | |
|---|---|---|---|
| 3,721,962 | 3/1973 | Foster et al. | 357/23 VT |
| 3,872,321 | 3/1975 | Matsue | 307/448 |
| 3,913,072 | 10/1975 | Catt | 365/200 |
| 4,190,849 | 2/1980 | Powell | 357/23 VT |
| 4,233,674 | 11/1980 | Russell et al. | 365/200 |

OTHER PUBLICATIONS

"Siemens Forschungs-U. Entwicklungsbericht", vol. 4, 1975, No. 6, pp. 345-351.
"IEEE Transactions on Electron Devices", vol. ED-26, Nr. 6, Jun. 1979, pp. 853-860.
"A Users Handbook of Semiconductor Memories", 1977, pp. 242-245 and 248, 249.

*Primary Examiner*—John S. Heyman
*Assistant Examiner*—Timothy P. Callahan
*Attorney, Agent, or Firm*—Hill, Van Santen, Steadman & Simpson

[57] ABSTRACT

A monolithically integrated circuit has circuit portions which are selectively connectible and disconnectible by switch elements from remaining portions of the integrated circuit. The switch elements are comprised of integrated field effect transistors in MIS technology with a gate insulating layer. By use of an electron beam, gate layers in some of the transistors can be selectively charged so as to cause a shift in a threshold voltage of those transistors. In this fashion, these transistors can assume a first switching state while the remaining transistors are in a second switching state when a potential is applied to the circuit.

11 Claims, 8 Drawing Figures

MONOLITHICALLY INTEGRATED CIRCUIT WITH CONNECTIBLE AND/OR DISCONNECTIBLE CIRCUIT PORTIONS

BACKGROUND OF THE INVENTION

The invention concerns a monolithically integrated circuit with one or several circuit portions which are each connectible and disconnectible by respective switch elements.

A circuit of this kind is known, for example, from the IEEE Transactions on Electron Devices, Vol. ED-26, No. 6, June, 1979, pages 853–860, incorporated herein by reference. There a 64 K-RAM memory circuit is shown wherein, for example, defective row lines, column lines or column decoders can be separated from the remaining circuit and replaced by means of co-integrated circuit portions of the same kind. The switching elements necessary for such a substitution are comprised of polysilicon linkage elements which are interrupted as needed by means of irradiation with a laser beam. However, the thermal load which occurs in the case of the interruption of such a linkage element is a disadvantage. This cannot be limited in the case of a laser beam precisely to the location of the linkage element. Accordingly the neighboring circuitry elements must be arranged at a sufficient distance from the linkage elements in order to avoid undesired damaging of the same by means of the laser beam.

SUMMARY OF THE INVENTION

It is an object of the invention to provide for the connection or, respectively, disconnection of individual circuit portions. Switching elements are used which only slightly increase the surface requirement of the integrated circuit. This problem is solved according to the invention by providing the switch elements as integrated field effect transistors designed in MIS technology with a gate insulating layer. Means are provided such as an electron beam for selectively charging the gate layer. In an uncharged state, the transistor assumes a first switching state given a first threshold voltage value. After charging, the transistor assumes a second switching state as a result of a shift of the threshold voltage.

An advantage which is attainable with the invention is that the switching elements required for the connection or, respectively, disconnection of circuit portions can be brought into the necessary switching state by means of an electron beam generated by a customary electron beam writer without an uncontrollable heating of their environment occurring which would require a corresponding enlargement of the necessary semiconductor surface. The connection and disconnection of the individual circuit portions proceeds in an advantageous manner after the application of the metallization plane or planes, so that the manufacturing process, including provision of the metal coatings, remains completely uninfluenced by the connection and disconnection processes which were mentioned. Besides this, no special masking step is necessary for these processes so that the integrated circuit, including the adjustable switching elements, can be constructed within the framework of a customary manufacturing method.

Preferred designs and further developments of the monolithically integrated circuit according to the invention are set forth in the claims together with advantageous methods for the disconnection or, respectively, connection of a circuit portion from or, respectively, to a monolithically integrated circuit.

DESCRIPTION OF THE PREFERRED EMBODIMENTS

Figure 1:
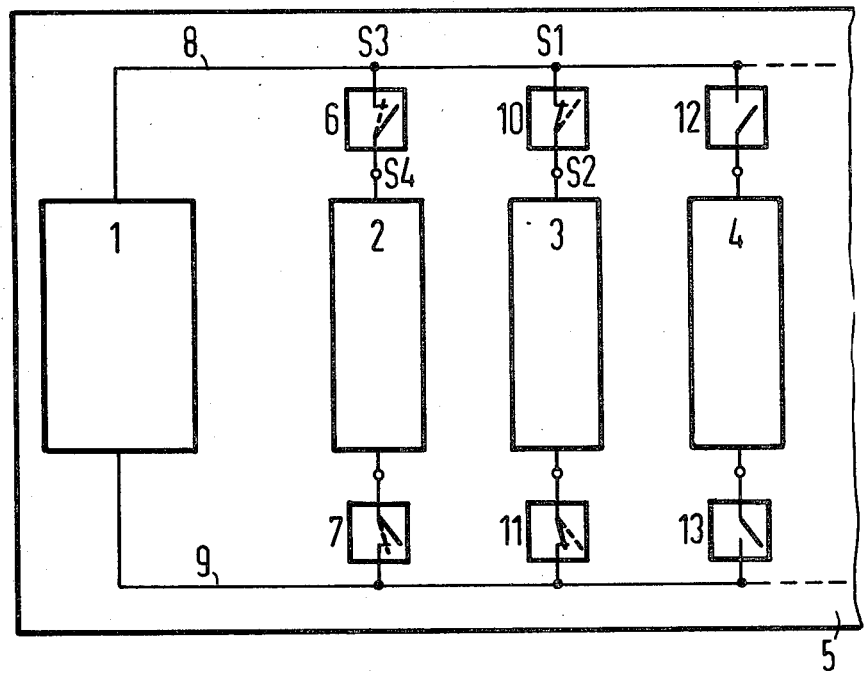
FIG. 1 shows a block diagram of a monolithically integrated circuit designed according to the invention.

In FIG. 1, a semiconductor circuit comprised of a first circuit portion 1 and further circuit portions 2 through 4 is integrated on a doped semiconductor body 5, for example of p-doped silicon. The circuit portion 2 is connected by closed switch positions of the switches 6, 7 drawn with a broken line to lines 8, 9 which in turn connect to circuit portion 1. The circuit portions 3 and 4 correspond to the circuit portion 2 in structure and manner of operation and are only connected with 1 via the switches 10, 11 or, respectively, 12, 13 when the function of the circuit portion 2 is disturbed, for example, by means of a crystal defect. In this case, the circuit portion 2 is first substituted for by the circuit portion 3. This occurs by means of an opening (solid line switch position) of the switch elements 6 and 7 and by means of a closing (solid line switch position) of the normally open switches 10 and 11. If it then occurs that also circuit portion 3 is defective, then switches 10 and 11 are again opened and switches 12 and 13 are closed whereby circuit portion 2 is then substituted for by circuit portion 4.

Figure 2:
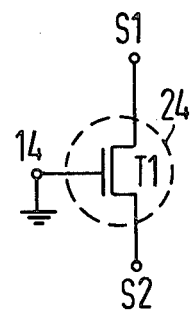
FIG. 2 shows a partial circuit of the system shown in FIG. 1.

Switch element 10 of the integrated circuit according to FIG. 1, which interrupts the path between the circuit points S1 and S2 in the broken-line switch position, is realized by means of a field effect transistor T1 depicted in FIG. 2. In the case of a p-doping of the semiconductor body 5, the transistor is first designed as a N-channel-MIS structure of the enhancement type. By a MIS structure, in general a structure is understood which encompasses a semiconductor body and a metal layer separated therefrom by means of an electrically insulating layer. The transistor T1 according to FIG. 2 has a source terminal or, respectively, drain terminal S1, and a drain terminal or, respectively, source terminal S2 which correspond to the circuit points of FIG. 1 designated in the same manner. Its gate terminal 14 is connected with the reference potential of the circuit.

Figure 3:
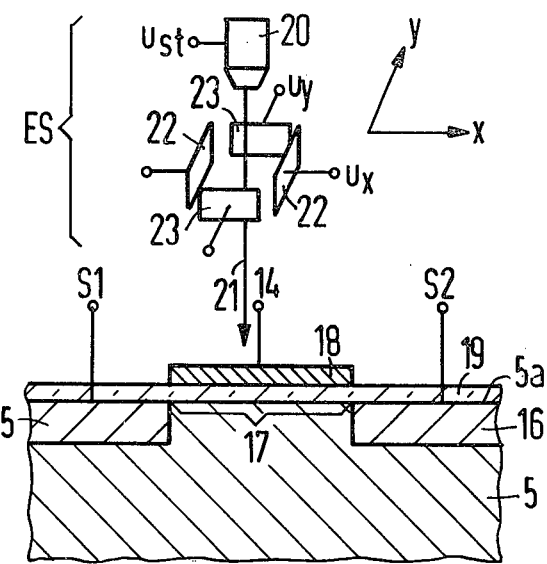
FIG. 3 shows a cross-sectional depiction of the circuit according to FIG. 2.

FIG. 3 shows a cross section through the field effect transistor T1. This transistor has two n+doped regions 15 and 16 inserted into the semiconductor body 5 which extend up to its interface 5a and represent the source and drain regions. Between these at the interface 5a there is located the channel region 17 which is covered over by a metallically conducting gate 18 separated from the interface 5a by means of a gate-insulating layer 19. The terminal leads 14, S1, and S2 drawn in FIG. 3 correspond to the terminal leads designated in the same manner in FIG. 2.

In FIG. 3, an electron beam writer ES is indicated which has an electron gun 20. An electron beam 21 exiting therefrom is deflected in the directions x and y by means of two deflection systems with pairs of plates 22 and 23 connected in each case with voltages $u_x$ and $u_y$. The sharply focused electron beam 21 now scans over the surface of the semiconductor body 5 in dependence upon the voltages $u_x$ and $u_y$, for example in individual lines which run parallel to one another. An electron beam writer of this sort which is equipped only with magnetic deflection systems instead of electrostatic deflection systems 22 and 23, is known from the magazine Philips Technical Survey 35, 1975/76, No. 3, pages 72-84, especially pages 73, FIG. 1, incorporated herein by reference.

In the case of such an electron beam writer, the electron beam 21 in each case is only connected by means of a supplied control voltage $u_{st}$ when it is just scanning over the channel region 17.

In the case of a current density of the electron beam 21 of, for example, 1 A/cm$^2$, an acceleration voltage of approximately 25 KeV and a local influence duration of approximately 10$^{-6}$s, charge carrier pairs form in the gate insulating layer 19 which, for example is comprised of SiO$_2$. These pairs in each case have negative charge carriers which flow off into the semiconductor body 5 connected with a reference potential, while positive charge carriers remain in the gate insulating layer 19 and charge this positively. A charging of approximately the same size results however, for example also for a current density of 100 A/cm$^2$ and an influence duration of 10$^{-8}$s with acceleration voltage remaining the same. It is apparent from this that the size of the positive charge essentially depends upon the product of current density and influence duration. The values given are, however, only statements of example and can be varied within the framework of the invention depending upon the size of the desired positive charge.

By means of a positive charging of the gate insulating layer 19, the threshold or cut-off voltage $U_t$ of the N-channel transistor T1 of the enhancement type is displaced from a relatively high value (without positive charge) to a relatively low value. In the case of a high value of threshold voltage, the switch element 10 formed by T1 is in a first switching state drawn in FIG. 1 with a broken line in which it separates the points S1 and S2 from one another. After a radiation of the channel region 17 by means of the electron beam 21, this switch occupies its second switching state in which it connects the circuit points S1 and S2 with one another with low resistance. In FIG. 2, the irradiation of the channel region undertaken is indicated by means of a broken line border 24.

The switch elements 11, 12 and 13 are constructed advantageously corresponding to the switch element 10. If the electron beam writer ES is thereby activated such that the electron beam 21 is connected during scanning of the channel regions 17 of the switch elements 10 and 11, but however is not connected with scanning of the switch elements 12 and 13, then only the circuit portion 3 is connected selectively to the circuit portion 1. If on the other hand the electron beam 21 is only connected during scanning of the switch elements 12 and 13, then only the circuit portion 4 is connected selectively to the circuit portion 1.

Another method of the selective displacement of the threshold voltages of predetermined switch elements, for example of the switch elements 10 and 11, is that first the threshold voltages $U_t$ of all switch elements (that is in the present case the switch elements 10 through 13), are shifted to a relatively low value by means of a common irradiation with x-rays or with the electron beam of an electron beam writer whose current density, influence duration, and acceleration voltage are selected in the described manner. Following this an additional selective irradiation of the channel regions of those switch elements, for example 12 and 13 whose original switch state should not be changed, takes place with an electron beam 21 of very large power density. This power density is selected such that the gate insulating layer 19 in each case heats up to a temperature of approximately 500°-600° C. whereby the stored positive charge carriers flow off into the semiconductor body 5 so that the gate insulating layer again is discharged and the original value of the threshold voltage is again attained. Accordingly, for example a current density of 100 to 500 A/cm$^2$ at a local influence duration of 10$^{-4}$s may be employed with an acceleration voltage of 25 KeV.

Figure 4:
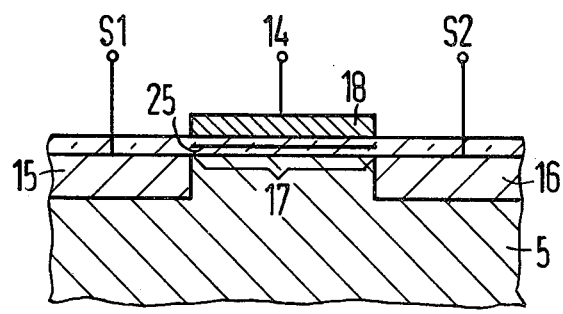
FIG. 4 shows in cross-section a first alternative embodiment of the partial circuit according to FIG. 2 in cross-section.
Figure 5:
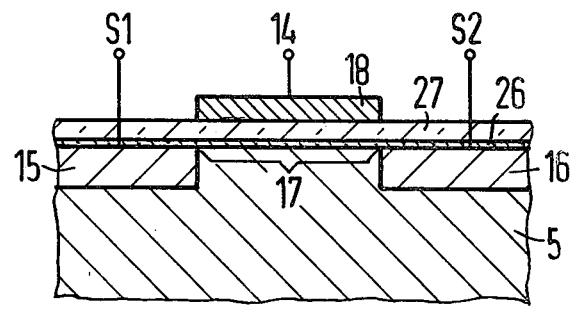
FIG. 5 shows a second alternative design of the partial circuit according to FIG. 2.

According to FIG. 4, the switch elements 10-13 can also be realized as N-channel field effect transistors of the depletion type whereby a polysilicon layer 25 connected free of external potentials and thus found in a "floating" state is introduced into the gate insulating layer 19. Alternatively to this, the gate insulating layer of the switch elements 10 through 13 can also be constructed of two different partial layers, for example of a SiO$_2$ layer 26 and a Si$_3$N$_4$ layer 27 lying thereover as indicated in FIG. 5. Here, there first takes place a negative charging of the polysilicon layer 25 or the interface between the partial layers in a customary manner, as for example known from "A User's Handbook of Semiconductor Memories" by E. R. Hnatek, John Wiley & Sons Publishing Company, New York, 1977, pages 242-245 and 248, 249 or from the Siemens Research and Development Reports, Volume 4, (1975), No. 6, pages 345-351, incorporated herein by reference.

The switch elements 10 through 13 here experience a common displacement of their threshold voltages $U_t$ to a higher value so that they block. Following this, for a selective connection of the circuit portion 3 to the circuit portion 1, only the channel regions 17 in the switch elements 10 and 11 are irradiated with the electron beam 21, whose parameters are again selected such that a heating of the gate insulating layers 19 or, respectively, 26 and 27 to 500°-600° C. occurs and thus a discharging of the same occurs. Accordingly, the threshold voltages $U_t$ of the switch elements 10 and 11 again displace to the lower value which they have without the negative charge.

If switch elements 10 through 13 in the case of an n-conducting semiconductor body 5 are comprised of P-channel transistors of the enhancement type, then their gate insulating layers are constructed corresponding to FIGS. 4 and 5. A non-selective application of negative charges first produces a displacement of the absolute values of the threshold voltages $U_t$ of the switch elements 10 through 13 to lower values, while a following selective irradiation of the channel region 17 of the switch elements 12 and 13 with a high energy electron beam 21 in the manner described leads to a heating and discharging of the corresponding gate insulating layers, and thus to a return displacement of the threshold voltages. From this, again a selective connection of the circuit portion 3 to the circuit portion 1 results.

In the case of switch elements 10 through 13 comprised of P-channel field effect transistors of the depletion type, for the selective connection of the circuit portion 3, first all switch elements 10 through 13 are positively charged in the region of their gate insulating layers. This can occur by means of an irradiation with x-rays or with an electron beam 21. This brings about a displacement of the absolute quantities of the threshold voltages to higher values. Following this, the switch elements 10 and 11 are subjected to a selective irradiation with an electron beam 21 of high energy for the purpose of discharging their gate insulating layers.

Figure 6:
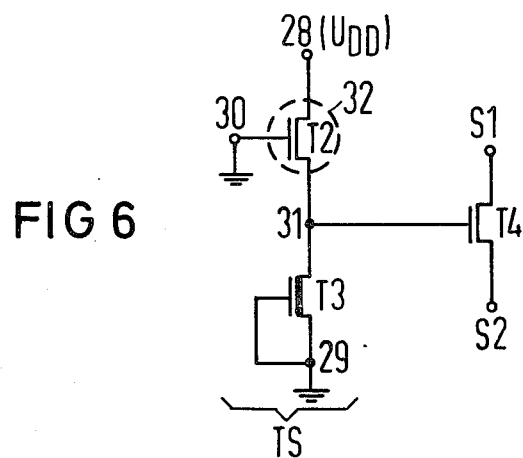
FIG. 6 shows an alternative partial circuit for FIG. 2.

In FIG. 6, another embodiment of the switch elements 10 through 13 is depicted. Here, the field effect transistor whose threshold voltage can be displaced by means of an irradiation with the electron beam 21 is designated T2, and is connected in series with a load element which is comprised of a field effect transistor T3 of the depletion type whose gate terminal is connected with its source terminal. This series connection is connected via the drain terminal 28 of T2 with the supply voltage $U_{DD}$, and via the source terminal 29 of T3 with the reference potential of the circuit. The gate terminal 30 of T2 also lies at reference potential. The connection point 31 of T2 and T3 is directed to the gate terminal of a field effect transistor T4 whose source-drain channel selectively connects the circuit points S1 and S2 of FIG. 1 with one another. In the one switching state of T2 characterized by a high value of the threshold voltage, the reference potential is fed to the gate of T4 so that the connection of the points S1 and S2 is interrupted. If the threshold voltage of T2 is displaced to a low value, for example by means of a selective irradiation of T2 with the electron beam 21 indicated in FIG. 6 by means of a broken line boundary 32, then the gate of T4 lies approximately at the supply voltage $U_{DD}$, so that T4 proceeds into the conducting state and points S1 and S2 are connected with one another at low resistance. The displacement of the threshold voltage of T2 occurs in the manner described already with use of FIGS. 2 through 5.

Figure 7:
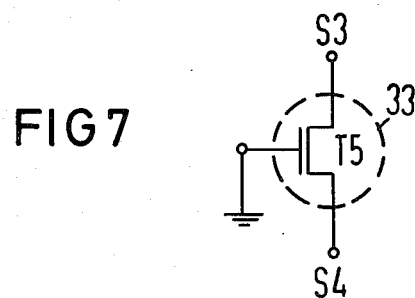
FIG. 7 shows another partial circuit of FIG. 1.

The switch element 6, which normally is found in the switch position drawn in FIG. 1 with a broken line, connects the circuit points S3 and S4 with one another. This element 6 is realized advantageously by means of a field effect transistor T5 which is depicted in FIG. 7, and which is designed as a P-channel MIS structure of the depletion type. Its gate terminal is placed at reference potential. The threshold voltage $U_t$ of T5 is relatively low so that the source-drain channel of T5 is found in the conducting state. The cross-section of T5 is designed corresponding to FIGS. 3, 4 or 5. If, according to FIG. 3, an irradiation of the channel region 17 of T5 takes place with an electron beam 21 whose parameters are again selected such that a positive charge of the gate insulating layer of T5 takes place, then the threshold voltage is raised to a relatively high value whereby the connection of the points S3 and S4 is interrupted. With this, then, the switching state of the switch element 6 drawn in with a solid line in FIG. 1 is attained. Also, if the switch element 7 (FIG. 1) is brought into this switching state by means of a corresponding selective irradiation with an electron beam 21, then the circuit portion 2 is disconnected from the circuit portion 1.

In the case of a N-channel transistor T5 of the depletion type designed as shown in FIGS. 4 and 5, as was already described a negative charging of the gate insulating layer can be undertaken in order to displace the value of the threshold voltage, which is at first low, to a higher value. Here, the switch element 6, comprised of a transistor T5, changes into the switching state drawn in with a solid line in which it interrupts the connection between the points S3 and S4. The application of the negative charge can proceed in the case of all switch elements together, whereby following this, those switch elements whose threshold voltage is not supposed to be displaced in this direction are irradiated selectively with an electron beam 21 of high energy so that their gate insulating layers are discharged. If the threshold voltages of the transistors T5 provided in the switch elements 6 and 7 of FIG. 1 in this manner are selectively displaced to a high value, then circuit portion 2 is disconnected from circuit portion 1.

Figure 8:
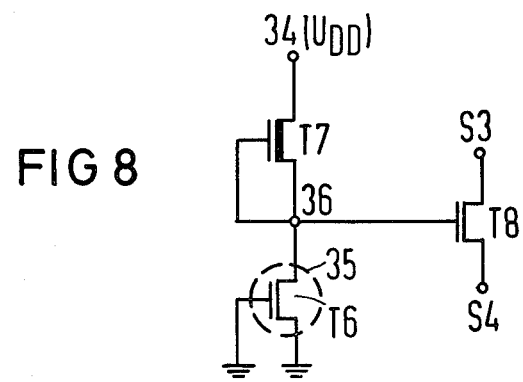
FIG. 8 shows an alternative partial circuit of FIG. 7.

An alternative to the circuit according to FIG. 7 embodied in N-channel technology is depicted in FIG. 8. The transistor whose threshold voltage is to be displaced by means of selective irradiation with an electron beam 21 in the direction toward a higher value, is designated in FIG. 8 with T6. Its drain terminal 36 is directed to a terminal lead 34 via a load element which is comprised of a field effect transistor T7 of the depletion type with source and gate terminals connected with one another. Terminal 34 is connected with the supply voltage $U_{DD}$. The source terminal of T6, like its gate terminal, also lies at reference potential. The drain terminal 36 is connected with the gate of a field effect transistor T8 whose source-drain channel either does or does not connect the circuit points S3 and S4 of FIG. 1 to be conducting. In the case of a N-channel transistor T6 of the enhancement type, the gate of T8 without an irradiation of the channel region of T6 with an electron beam 21 lies approximately at the supply voltage $U_{DD}$ because of the blocked state of T6. Accordingly, S3 and S4 (in the case of T8 as an N-channel transistor of the enhancement type) are connected conducting with one another. In the case of a selective irradiation (35 in FIG. 8) of T6 with an electron beam 21 by means of which its threshold voltage is shifted in the direction of a smaller value, T6 becomes conducting so that the gate of T8 is placed at the reference potential and the conducting connection of points S3 and S4 is interrupted.

In the case of a design of T5 as an N-channel transistor of the enhancement type, when still other transistors of the same type are also integrated on the semiconductor body 5 whose threshold voltages are not to be shifted, first all these transistors are provided with a negative charge in the manner already described. Then those transistors whose threshold voltages are not to be displaced are additionally selectively irradiated with an electron beam 21 having an energy such that the gate insulating layers again discharge as a result of sufficiently high heating. By means of these two techniques, a selective displacement of the threshold voltage of T5 takes place in the direction toward a higher value.

If T5 is finally realized as a P-channel transistor of the enhancement type, then its gate must be negatively charged in order to attain a conducting connection of the points S3 and S4. By means of a selective irradiation of the channel region of T5 with an electron beam of high energy, the threshold voltage is shifted in a direction toward a higher value and the conducting connection between S3 and S4 is interrupted.

The described switching processes on the semiconductor body 5 can be undertaken after the metal coatings have been applied, and in particular, after measurements on the semiconductor circuit have been taken regarding the functional capability of the individual circuit portions 1 through 4.

A preferred field of application of the integrated circuit according to the invention exists in the case of circuits whose parameters are to be adjusted to specific predetermined values by means of connection or disconnection of individual circuit portions. Such an adjustment of circuit parameters is also designated as digital trimming.

Although various minor modifications may be suggested by those versed in the art, it should be understood that I wish to embody within the scope of the patent warranted hereon, all such embodiments as reasonably and properly come within the scope of my contribution to the art.

I claim as my invention:

1. A monolithically integrated circuit, comprising: at least one circuit portion which is a replacement circuit for other functionally disturbed circuit portions of the same kind in the integrated circuit connectible and disconnectible by at least one switch element from other circuit portions; the switch element having an integrated field effect transistor designed as a MIS structure with a gate insulating layer separating a gate from a substrate; the gate being directly connected to a reference potential of the circuit; means for selectively charging the gate layer with the gate connected to the reference potential so that an uncharged state of the gate insulating layer can determine a high or low value of a threshold voltage of the transistor when the gate is connected to the reference potential and thus determine a first switching state of the field effect transistor while a charged state of the gate insulating layer may determine a low or high value of the threshold voltage opposite from the uncharged state and thus a second switching state of the field effect transistor; and said means for selectively charging comprising an electron beam induced charge in the gate insulating layer which occurs when a channel region of the transistor is scanned while the gate is connected to the reference potential.

2. A circuit according to claim 1 wherein the circuit portion and switching element are co-integrated.

3. A monolithically integrated circuit according to claim 1 wherein a source-drain channel of the field effect transistor forms a switching path which connects and disconnects the circuit portion associated therewith to a remaining circuit portion.

4. A monolithically integrated circuit according to claim 1 wherein the field effect transistor is contained in a transistor stage whose output is connected to a gate of a further field effect transistor whose source-drain channel is connected to form a switch path which connects the associated circuit portion with a remaining circuit portion.

5. A monolithically integrated circuit according to claim 1 wherein a conducting layer is inserted into the gate insulating layer of the field effect transistor which stabilizes charge states of the gate insulating layer.

6. A monolithically integrated circuit according to claim 1 wherein the field effect transistor is designed as an MNOS transistor whose gate insulating layer is comprised of a $SiO_2$ layer and a $Si_3N_4$ layer adjacent thereto.

7. A method for the disconnection and connection of a circuit portion from other circuit portions in a monolithically integrated circuit, comprising the steps of:
providing a field effect transistor with a gate insulating layer and a gate connected to a reference potential of the integrated circuit as a switching element for connecting and disconnecting the circuit portion depending upon whether the circuit portion is correctly functioning; and
with the gate being connected to the reference potential charging a threshold voltage of the field effect transistor by deflecting an electron beam such that it scans over a channel region of the transistor, a current density, influence duration and acceleration voltage of the electron beam being selected such that in said gate insulating layer of the transistor a positive charge is created which shifts the value of the threshold voltage from a lower value existing without this charge to a higher value, or vice-versa.

8. A method for the disconnection and connection of circuit portions from other circuit portions in a monolithically integrated circuit, comprising the steps of:
providing an integrated field effect transistor with a gate insulating layer and a gate connected to a reference potential of the integrated circuit as a switching element for each of the circuit portions to connect and disconnect the same depending upon functionality of the circuit portions;
changing a threshold voltage of some of the field effect transistors by the steps of:
with the gate connected to the reference potential, irradiating all of the integrated field effect transistors as switching elements to cause a common shift of their threshold voltages by creating a positive charge in said gate insulating layer of each of the transistors, and
with the gate connected to the reference potential selectively irradiating a channel region of at least one of the field effect transistors with an electron beam whose current density, influence duration, and acceleration voltage are selected such that the gate insulating layer of this field effect transistor heats to a temperature whereby it is again discharged so that the threshold voltage again assumes its original value.

9. A method according to claim 8 wherein for the step of irradiating all of the switching elements x-rays are employed.

10. A method according to claim 8 wherein for the step of irradiating all switching elements, an electron beam is employed whose current density, influence duration, and acceleration voltage are selected such that the gate insulating layer is positively charged.

11. A method for the disconnection and connection of circuit portions from other circuit portions in a monolithically integrated circuit, comprising the steps of:
providing an integrated field effect transistor with a gate insulating layer and a gate connected to a reference potential of the integrated circuit as a switching element for each of the circuit portions to connect and disconnect the same depending upon status checks of the circuit portions;
changing a threshold voltage of some of the field effect transistors by the steps of
negatively charging gate insulating layers of all of the integrated field effect transistors as switching elements while the gates are connected to the reference potential so that the transistors experience a common shift of their threshold voltages, and while the gate is connected to the reference potential selectively irradiating channel regions of at least one of the field effect transistors with an electron beam whose current density, influence duration, and acceleration voltage are selected such that the gate insulating layer of the field effect transistor heats to a temperature whereby it is again discharged, so that the field effect transistor has a threshold voltage which corresponds to the original value present without the applied negative charge.

* * * * *